(12) United States Patent
Igo et al.

(10) Patent No.: US 8,389,964 B2
(45) Date of Patent: Mar. 5, 2013

(54) ION IMPLANTING APPARATUS AND DEFLECTING ELECTRODE

(75) Inventors: Tetsuya Igo, Kyoto (JP); Tadashi Ikejiri, Kyoto (JP); Takatoshi Yamashita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 13/128,893

(22) PCT Filed: Aug. 31, 2009

(86) PCT No.: PCT/JP2009/065222
§ 371 (c)(1),
(2), (4) Date: Aug. 29, 2011

(87) PCT Pub. No.: WO2010/058645
PCT Pub. Date: May 27, 2010

(65) Prior Publication Data
US 2011/0297843 A1 Dec. 8, 2011

(30) Foreign Application Priority Data
Nov. 21, 2008 (JP) .................................. 2008-298794

(51) Int. Cl.
*H01J 37/00* (2006.01)
*H01L 21/265* (2006.01)
(52) U.S. Cl. .............................. 250/492.21; 250/396 R
(58) Field of Classification Search .............. 250/396 R, 250/492.21
See application file for complete search history.

(56) References Cited

U.S. PATENT DOCUMENTS

| 6,160,262 A * | 12/2000 | Aoki et al. | 250/492.21 |
| 7,435,976 B2 * | 10/2008 | Naito et al. | 250/492.21 |
| 7,605,382 B2 * | 10/2009 | Yamashita et al. | 250/492.21 |
| 7,635,850 B2 * | 12/2009 | Yamashita et al. | 250/492.21 |
| 7,655,929 B2 * | 2/2010 | Umisedo et al. | 250/492.21 |
| 2011/0297843 A1 * | 12/2011 | Igo et al. | 250/396 R |

FOREIGN PATENT DOCUMENTS

| JP | 2002-198294 A | 7/2002 |
| JP | 2005-190979 A | 7/2005 |

(Continued)

OTHER PUBLICATIONS

International Search Report w/translation from PCT/JP2009/065222 dated Oct. 13, 2009 (2 pages).

(Continued)

*Primary Examiner* — David A Vanore
(74) *Attorney, Agent, or Firm* — Osha Liang LLP

(57) ABSTRACT

An ion implanting apparatus includes: an electrostatic accelerating tube for causing an ion beam extracted from an ion source to have a desirable energy, and deflecting the ion beam to be incident on a target, the electrostatic accelerating tube including deflecting electrodes provided to interpose the ion beam therebetween. The deflecting electrodes include a first deflecting electrode and a second deflecting electrode to which different electric potentials from each other are set. The second deflecting electrode is provided on a side where the ion beam is to be deflected and includes an upstream electrode provided on an upstream side of the ion beam and a downstream electrode provided apart from the upstream electrode toward a downstream side. An electric potential of the upstream electrode and an electric potential of the downstream electrode are independently set from each other.

4 Claims, 7 Drawing Sheets

FOREIGN PATENT DOCUMENTS

JP          3738734 B2     11/2005

OTHER PUBLICATIONS

Patent Abstracts of Japan Publication No. 2005-190979 dated Jul. 14, 2005 (1 page).

Patent Abstracts of Japan Publication No. 2002-198294 dated Jul. 12, 2002 (1 page).

Written Opinion from PCT/JP2009/065222 dated Oct. 13, 2009 (4 pages).

Patent Abstracts of Japan Publication No. 2003-234081 dated Aug. 22, 2003 (1 page).

\* cited by examiner

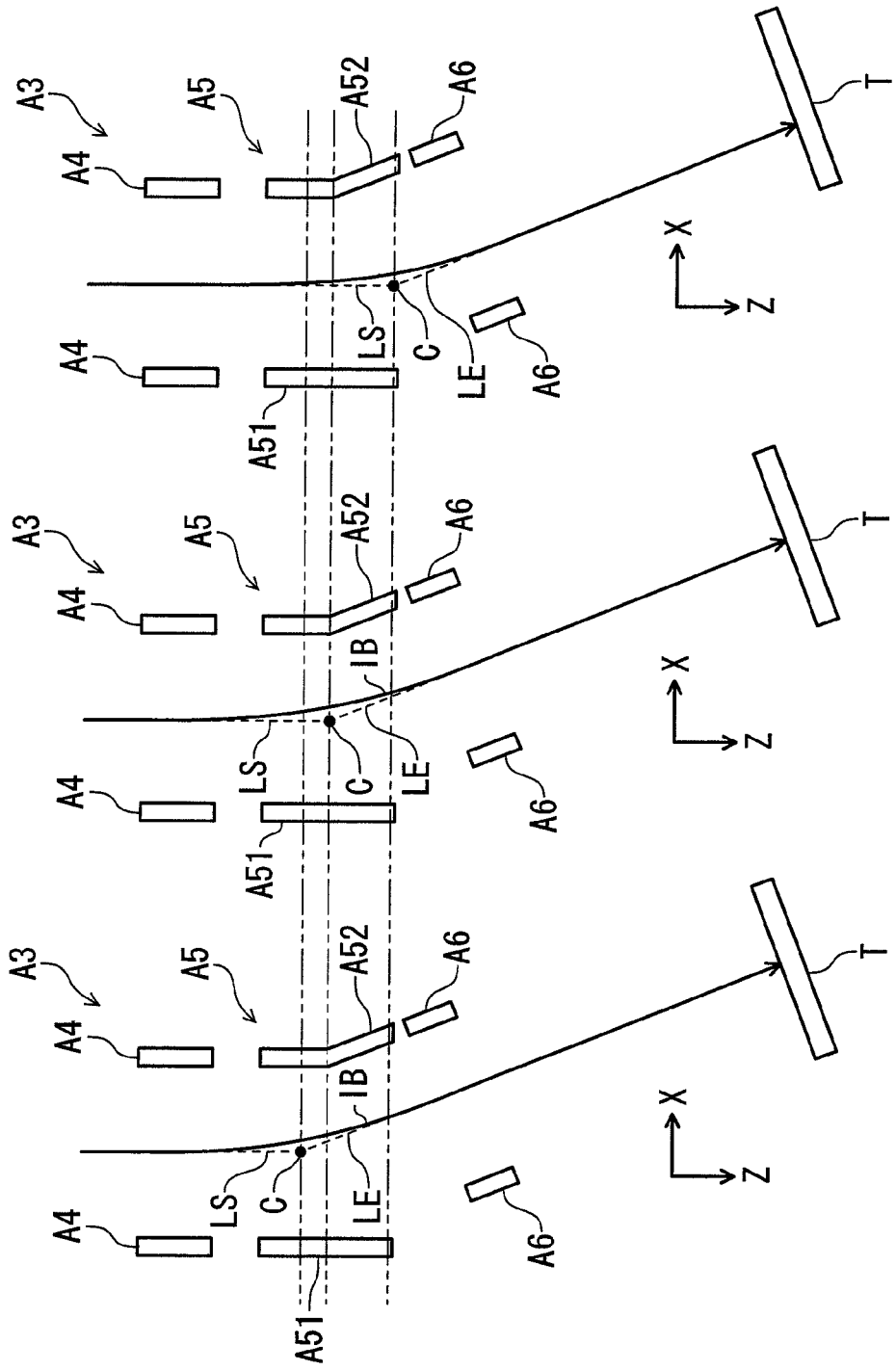

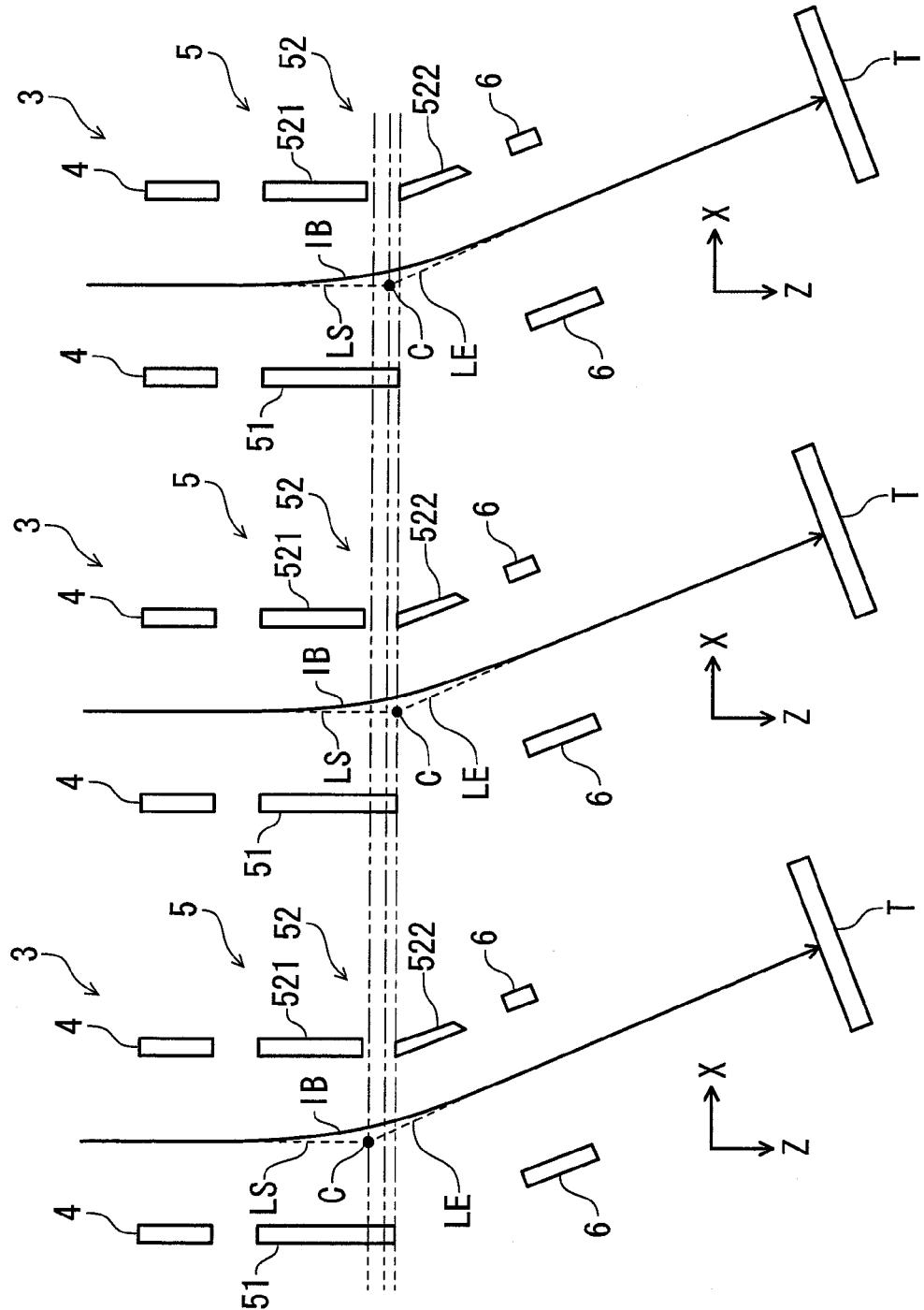

ION IMPLANTING APPARATUS AND DEFLECTING ELECTRODE

TECHNICAL FIELD

The present invention relates to a deflecting electrode for accelerating or decelerating and deflecting an ion beam and an ion implanting apparatus including the same.

BACKGROUND

Conventionally, an ion implanting apparatus disclosed in Patent Document 1 is proposed to prevent an ion having a different energy from a desirable energy or a neutral particle from mixing into an ion beam in an ion implantation.

As shown in FIG. 1A, an ion implanting apparatus A100 serves to select only an ion of a desirable type from an ion beam IB extracted at a certain voltage from an ion source A1 by means of an analyzing magnet A2 and to cause the ion beam IB to pass through an electrostatic accelerating tube A3 via the analyzing magnet A2, thereby obtaining a desirable energy, and furthermore, to deflect the ion beam IB to be incident on a target T at a predetermined incident angle.

The electrostatic accelerating tube A3 will be described in detail. As shown in FIG. 1B, an accelerating/decelerating electrode A4, a deflecting electrode A5 and a counter electrode A6 are provided in this order from an upstream of the ion beam IB. The deflecting electrode A5 is constituted by a first deflecting electrode A51 and a second deflecting electrode A52. The first deflecting electrode A51 is provided in parallel with a travelling direction of the ion beam IB which is not deflected. The second deflecting electrode A52 has an upstream portion which is parallel with the travelling direction of the ion beam IB that is not deflected and a downstream portion which is formed in parallel with a travelling direction of the ion beam IB subjected to the deflection and takes a substantially dogleg shape. Electric potentials of the first deflecting electrode A51 and the second deflecting electrode A52 are caused to be different from each other, thereby accelerating/decelerating and deflecting the ion beam IB. As a result, the ion beam IB is caused to have a desirable energy and an ion having the other energy is separated through the deflection. Consequently, only the ion beam IB having the desirable energy can be incident on the target T.

In the case in which the ion beam IB is accelerated/decelerated in the ion implanting apparatus A100, however, there is a problem. In other words, a deflecting center position C to be an intersection point of an optical axis LS of a straight part in the ion beam IB which is not deflected and an optical axis LE of a straight part in the ion beam IB subjected to the deflection is shifted so that a center position of the ion beam IB which is incident on the target T is shifted from a desirable place.

More specific description will be given by taking, as an example, an ion implantation in the case in which the ion beam IB is incident on the target T substantially vertically as shown in FIG. 2. FIG. 2B shows a normal state in which the acceleration/deceleration is not carried out but the ion beam IB is incident on the target T with the energy of the extracted ion beam IB maintained. At this time, a center of the ion beam IB is set to be incident on that of the target T.

On the other hand, in the case in which the ion beam IB shown in FIG. 2A is accelerated, that is, the ion beam IB is incident, on the target T, with a greater energy than the energy of the extracted ion beam IB, the deflecting center position C is changed toward an upstream side of the ion beam IB as compared with the normal state shown in FIG. 2B. As a result, the center of the ion beam IB which is incident on the target T is shifted slightly in a deflecting direction of the ion beam IB.

In the case in which the ion beam IB shown in FIG. 2C is decelerated, that is, the ion beam IB is incident, on the target T, with a smaller energy than the energy of the extracted ion beam IB, furthermore, the deflecting center position C is greatly changed toward a downstream side of the ion beam IB as compared with the normal state shown in FIG. 2B. As a result, the center of the ion beam IB which is incident on the target T is greatly shifted in an anti-deflecting direction of the ion beam IB.

A simulation condition in FIGS. 2A to 2C is set in such a manner that an extracting voltage of the ion beam IB is 30 kV, and the ion beam IB is accelerated/decelerated through the electrostatic accelerating tube A3 to have a desirable energy, for example, 60 keV in the acceleration, 30 keV in the normal state and 1 keV in the deceleration and is then irradiated perpendicularly to a surface of the target T.

In the case in which the ion beam IB is particularly decelerated, thus, the deflecting center position C is shifted greatly. For this reason, the center position of the ion beam IB which is incident on the target T is also shifted. Consequently, it is difficult to carry out a desirable ion implantation.

If an electric potential of the deflecting electrode A5 is regulated to adjust the incident position of the ion beam IB on the target T into a desirable position in the ion implanting apparatus A100, moreover, an angle of the incidence on the target T is varied as shown in FIG. 3. For this reason, it is still impossible to carry out the desirable ion implantation.

PATENT DOCUMENT

Patent Document 1: Japanese Patent No. 3738734

SUMMARY OF THE INVENTION

One or more embodiment of the invention prevent a deflecting center position C from being varied greatly also in the case in which an ion beam is accelerated/decelerated, particularly, is decelerated. In other words, one or more embodiments provide an ion implanting apparatus capable of setting a center position of an ion beam to be incident on a target into a desirable position with an angle of incidence of the ion beam on the target maintained to be a desirable angle.

More specifically, an ion implanting apparatus according to one or more embodiments of the invention includes an electrostatic accelerating tube for causing an ion beam extracted from an ion source to have a desirable energy and deflecting the ion beam to be incident on a target, and deflecting electrodes constituting a part of the electrostatic accelerating tube are provided to interpose the ion beam therebetween and include a first deflecting electrode and a second deflecting electrode to which different electric potentials from each other are set, the second deflecting electrode is provided on a side where the ion beam is to be deflected and includes an upstream electrode provided on an upstream side of the ion beam and a downstream electrode provided apart from the upstream electrode toward a downstream side, and the upstream electrode and the downstream electrode are constituted to independently enable setting of electric potentials, respectively.

Moreover, a deflecting electrode according to one or more embodiments of the invention constitutes a part of an electrostatic accelerating tube for causing an ion beam extracted from an ion source to have a desirable energy and deflecting the ion beam to be incident on a target, and includes a first deflecting electrode and a second deflecting electrode which are provided to interpose the ion beam therebetween and to which different electric potentials from each other are set, the second deflecting electrode includes an upstream electrode provided on an upstream side of the ion beam and a downstream electrode provided apart from the upstream electrode toward a downstream side, and the upstream electrode and the downstream electrode are constituted to independently enable setting of electric potentials, respectively.

Thus, the second deflecting electrode includes the upstream electrode and the downstream electrode and is constituted in such a manner that they can independently set the electric potentials, respectively. Therefore, it is possible to especially increase a degree of freedom for controlling an electric field formed between the first deflecting electrode and the second deflecting electrode. In particular, the downstream electrode is provided apart from the upstream electrode. Consequently, it is possible to form an electric field having an equipotential line passing through a portion between the upstream electrode and the downstream electrode. Accordingly, it is possible to control, into a desirable shape, an electric field on the downstream side of the second deflecting electrode of which shape is conventionally hard to control into a proper shape. Also in the case in which the ion beam is decelerated and is thus incident on the target, therefore, it is possible to deflect the ion beam in such a manner that a deflecting center position is hardly changed toward the downstream side. Consequently, it is possible to regulate a center of the ion beam so as to be hardly shifted from a desirable position of the target with an incident angle maintained to be a desirable angle.

By properly setting the electric potentials of the upstream electrode and the downstream electrode, furthermore, it is possible to cause the center of the ion beam to be incident on a predetermined position of the target at a desirable incident angle in the same manner as in the related art also in the case in which the ion beam is accelerated or the case in which the ion beam is not accelerated/decelerated.

As a specific mode of the electric potentials of the upstream electrode and the downstream electrode, the ion beam has a positive electric charge, and the downstream electrode is set to have a higher electric potential than that of the upstream electrode when the ion beam is decelerated to have a lower energy than that of the ion beam which is extracted. Consequently, there is formed such an electric field that an equipotential line having an electric potential which is higher than an electric potential set to the upstream electrode and is lower than an electric potential set to the downstream electrode passes through a portion between the upstream electrode and the downstream electrode. Therefore, it is possible to set a shape or magnitude of an electric field in the vicinity of a termination of the second deflecting electrode which is greatly influenced by a sufficient deceleration of the ion beam in such a manner that the deflecting center position is not changed.

When the ion beam is accelerated to have a higher energy than that of the ion beam which is extracted, it is preferable that the downstream electrode should be set to have an electric potential which is substantially equal to that of the upstream electrode. Also in the acceleration of the ion beam, consequently, it is possible to efficiently deflect the ion beam by applying a low voltage to the upstream voltage or the downstream voltage to set a predetermined electric potential. Thus, it is possible to include a quantity of a change in the deflecting center position toward the upstream side within a range which can be permitted. In the case in which a variation in the deflecting center position is reduced more greatly, it is preferable to set, to the downstream electrode, a lower electric potential than that of the upstream electrode, thereby setting a proper electric potential.

In order to enable an increase in an electrode length of the second deflecting electrode, thereby enabling an efficient deflection of an ion beam having a high energy without using a high power, it is preferable that the first deflecting electrode and the upstream electrode should be extended in parallel with a traveling direction of the ion beam which is not deflected, and the downstream electrode should be extended in parallel with a traveling direction of the ion beam which is deflected.

In order to reduce an influence of a fluctuation in a voltage due to a collision of the deflected ion with the deflecting electrode, and furthermore, to properly set a resolution of an electric potential to be set, thereby enabling an easy control in the deceleration of the ion beam, particularly, it is preferable that a length in which the upstream electrode is extended in the traveling direction of the ion beam which is not deflected should be greater than a length in which the downstream electrode is extended in the traveling direction of the ion beam which is deflected. Consequently, a voltage to be applied for setting the downstream electrode to have a predetermined electric potential can be increased to some degree. Therefore, the fluctuation in the voltage is small with respect to the applied voltage if any. Thus, the fluctuation in the voltage can be disregarded. In addition, it is not necessary to carry out a control with a high resolution.

According to the deflecting electrode and the ion implanting apparatus using the same in accordance with one or more embodiments of the invention, thus, in the case in which the ion beam is particularly decelerated, the deflecting center position is not changed greatly as compared with the case in which the acceleration/deceleration is not carried out. Accordingly, it is possible to cause the center of the ion beam to be incident on the predetermined position of the target with the angle of incidence of the ion beam on the target maintained to be a predetermined angle.

BRIEF DESCRIPTION OF THE DRAWINGS

FIG. 2A is a typical comparison view showing a change in a deflecting center position in the case in which an ion beam is accelerated in the conventional ion implanting apparatus, FIG. 2B is a typical comparison view showing a normal state, and FIG. 2C is a typical comparison view showing the case in which a deceleration is carried out.

FIG. 5A is a typical comparison view showing a change in a deflecting center position in the case in which an ion beam is accelerated according to one or more embodiments, FIG. 5B is a typical comparison view showing a normal state, and FIG. 5C is a typical comparison view showing the case in which a deceleration is carried out.

DETAILED DESCRIPTION

One or more embodiments in of the invention will be described below with reference to the drawings. A deflecting electrode 5 and an ion implanting apparatus 100 using the same according to one or more embodiments of the invention are used for implanting an ion at a predetermined angle, depth and concentration into a surface of a silicon substrate to change or modify a property thereof, for example.

Figure 4A:
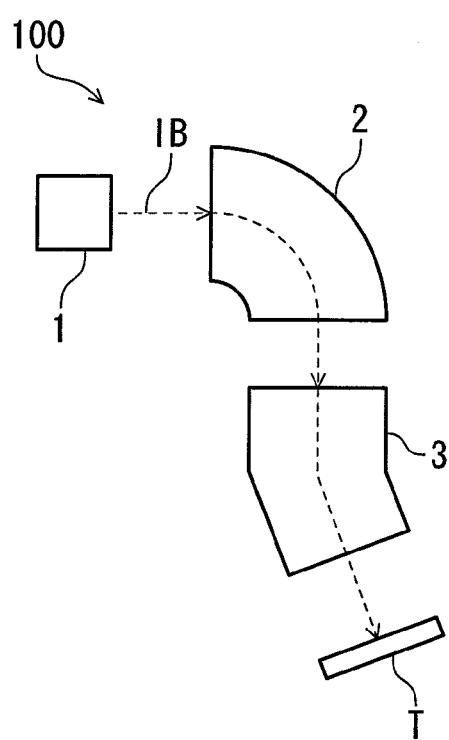
FIG. 4A is a typical view showing a structure according to an embodiment of an ion implanting apparatus in accordance with one or more embodiments of the invention and FIG. 4B is a typical view showing a structure according to an embodiment of an electrostatic accelerating tube in accordance with one or more embodiments of the invention.

The ion implanting apparatus 100 according to one or more embodiments of the embodiment serves to select only an ion of a desirable type from an ion beam IB extracted from an ion source 1 shown in FIG. 4A at a certain voltage by means of an analyzing magnet 2, to cause the ion beam IB to pass through an electrostatic accelerating tube 3 via the analyzing magnet 2, thereby obtaining a desirable energy, and furthermore, to deflect the ion beam IB to be incident on a target T at a predetermined incident angle. In the following description, a plane formed by an optical axis of the ion beam IB is set to be an XZ plane, a direction in which the ion beam IB is incident on the electrostatic accelerating tube 3 is set to be a Z axis, a side on which the ion beam 2B is deflected is caused to be positive and an X axis is thus set, and a coordinate axis is set to form a right-handed system.

In the description of the embodiment, a spot-like ion beam IB having a positive electric charge is taken as an example. By a beam taking a predetermined shape such as an ion beam IB extracted like a ribbon, however, it is possible to produce an almost identical advantage with the same structure. In the case of the ion beam IB having a negative electric charge, moreover, it is preferable that an electric potential should be set to be reverse to that in the case of the ion beam IB having the positive electric charge.

Figure 4B:
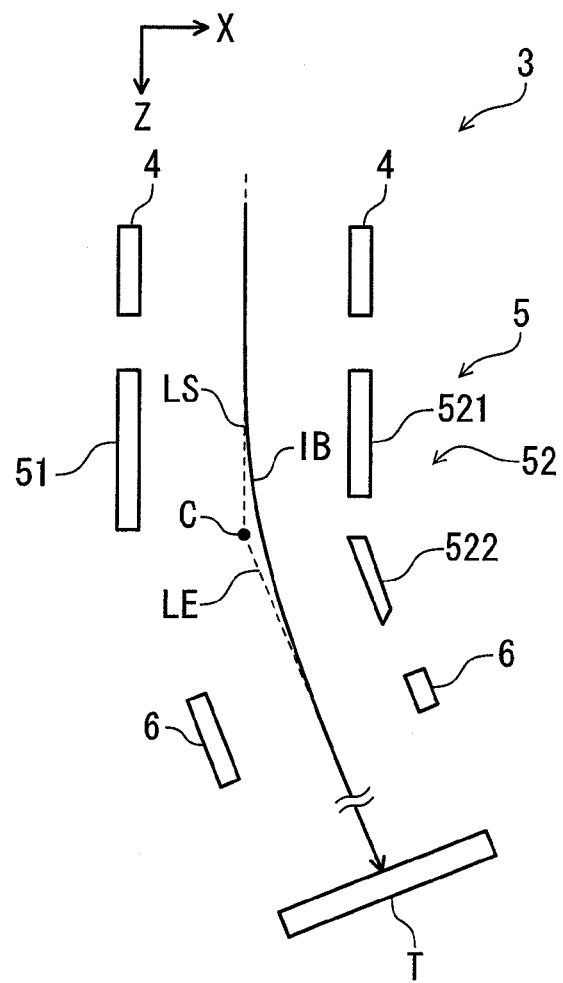

As shown in FIG. 4B, the electrostatic accelerating tube 3 includes at least an accelerating/decelerating electrode 4, the deflecting electrode 5 and a counter electrode 6 in this order from an upstream side of the ion beam IB. The electrostatic accelerating tube 3 has such a structure that an acceleration or deceleration is carried out in two stages between the accelerating/decelerating electrode 4 and the deflecting electrode 5 and between the deflecting electrode 5 and the counter electrode 6.

The accelerating/decelerating electrode 4 is formed as a pair of parallel plate electrodes provided to interpose the ion beam IB incident on the electrostatic accelerating tube 3 therebetween. The respective electrodes are electrically connected to each other and an electric potential V1 is applied thereto. The electric potential V1 is set to be positive and high when the ion beam IB is to be accelerated, and is set to be negative and high when the ion beam IB is to be decelerated.

The deflecting electrode 5 is constituted by a first deflecting electrode 51 and a second deflecting electrode 52. The respective electrodes 51 and 52 are provided in such a manner that their opposed surfaces interpose the ion beam IB therebetween.

The first deflecting electrode 51 is a plate electrode and is provided in such a manner that a direction of extension of the opposed surface to the ion beam IB is parallel with the Z axis to be an optical axis LS of the ion beam IB which is incident on the electrostatic accelerating tube 3. The first deflecting electrode 51 is usually grounded in such a manner that an electric potential V2a to be set is 0 V.

The second deflecting electrode 52 is constituted to take a substantially dogleg shape seen in a Y-axis direction as shown in FIG. 4B. The second deflecting electrode 52 is constituted by an upstream electrode 521 and a downstream electrode 522. The upstream electrode 521 is a plate electrode provided in such a manner that its opposed surface is parallel with the first deflecting electrode 51. The downstream electrode 522 is a plate electrode provided apart from the first deflecting electrode 51 toward a downstream side of the ion beam IB.

Description will be given to a relationship between the upstream electrode 521 and the downstream electrode 522. A length of the upstream electrode 521 in a direction along the ion beam IB is set to be greater than that of the downstream electrode 522. Moreover, an electric potential V2b of the upstream electrode 521 and an electric potential V2c of the downstream electrode 522 can be set independently of each other.

The counter electrode 6 causes a collision of ions having different quantities of a deflection because of an energy other than a desirable energy in ions deflected via the deflecting electrode 5 or neutral particles which are not deflected, and thereby removes them. The counter electrode 6 is constituted by a pair of parallel plate electrodes provided to interpose the optical axis of the ion beam IB which is incident on the target T after the deflection therebetween. An electric potential V3 of the counter electrode 6 is usually grounded to be 0 V in order to prevent an electric field generated in the electrostatic accelerating tube 3 from flowing to the downstream side of the counter electrode 6.

A view shows a result of a simulation in the case in which the ion beam IB is deflected and is thus incident on the target T by using the ion implanting apparatus 100 having the structure described above. The electric potentials of the accelerating/decelerating electrode 4, the upstream electrode 521 and the downstream electrode 522 are set depending on a state of the acceleration/deceleration of the ion beam IB. Table 1 shows electric potentials set in the respective states. In this case, an extracting voltage of the ion beam IB is 30 kV. Moreover, the energy of the ion beam IB is set to be 60 keV in the acceleration, is normally set to be 30 keV and is set to be 1 keV in the deceleration. Moreover, the ion beam IB is irradiated perpendicularly to the surface of the target T. As is apparent from the Table 1, according to the simulation in the acceleration of FIG. 5A, the electric potential V2b of the upstream electrode 521 is set to have an equal value to that of the electric potential V2c of the downstream electrode 522.

In the deceleration of FIG. 5C, moreover, the electric potential of the downstream electrode 522 is set to be higher than that of the upstream electrode 521. In the embodiment, the ion beam IB having the positive electric charge is deflected and decelerated. For this reason, the upstream electrode 521 and the downstream electrode 522 are set to have negative electric potentials.

In some cases in which the downstream electrode 522 is to be set to have a higher electric potential than that of the upstream electrode 521, accordingly, it should be set to have a negative electric potential in smaller order than the upstream electrode 521. Consequently, it is necessary to prepare a power supply having a high resolution corresponding to the downstream electrode 522 in small order. As a result, a cost is increased. In the embodiment, therefore, lengths of the upstream electrode 521 and the downstream electrode 522 or positions in which they are provided apart from each other are regulated in such a manner that the order of the electric potential set to the upstream electrode 521 is not greatly different from that of the electric potential set to the downstream electrode 522.

TABLE 1

|  | Accelerating/ Decelerating electrode 4 Electric potential V1 | Upstream electrode 521 Electric potential V2b | Downstream electrode 522 Electric potential V2c |
|---|---|---|---|
| FIG. 5A Acceleration | 30 kV | −32 kV | −32 kV |
| FIG. 5B Normal | 0 V | −17 kV | −17 kV |
| FIG. 5C Deceleration | −29 kV | −5 kV | −0.9 kV |

Figure 1A:
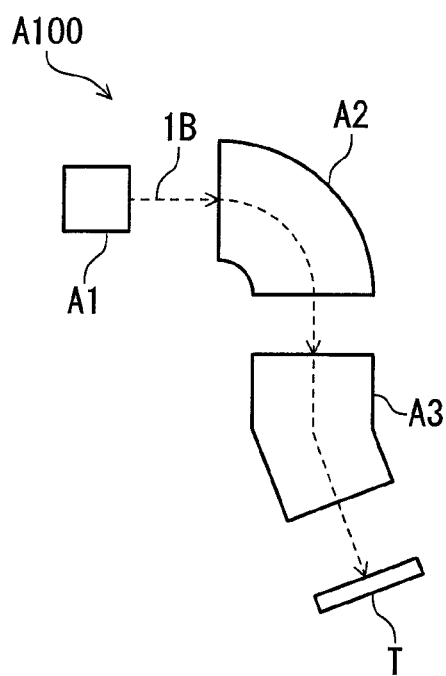
FIG. 1A is a typical view showing a structure of a conventional ion implanting apparatus.
Figure 1B:
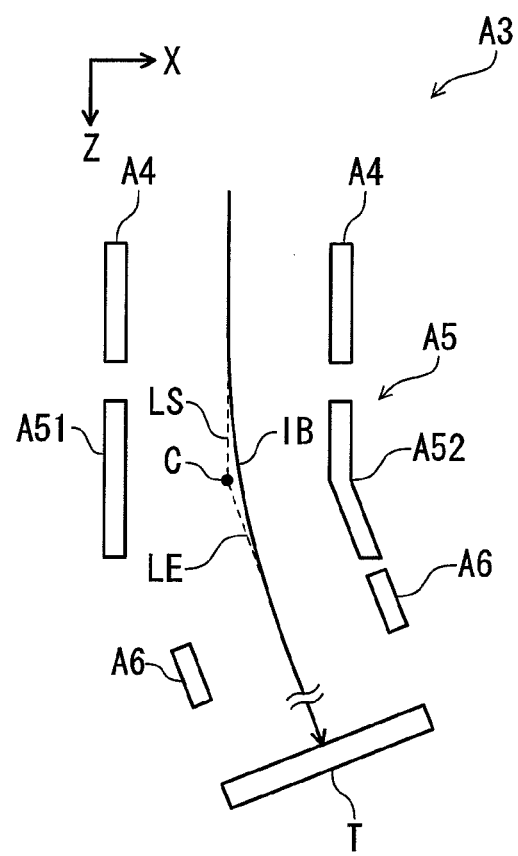
FIG. 1B is a typical view showing a structure of a conventional electrostatic accelerating tube.
Figure 3:
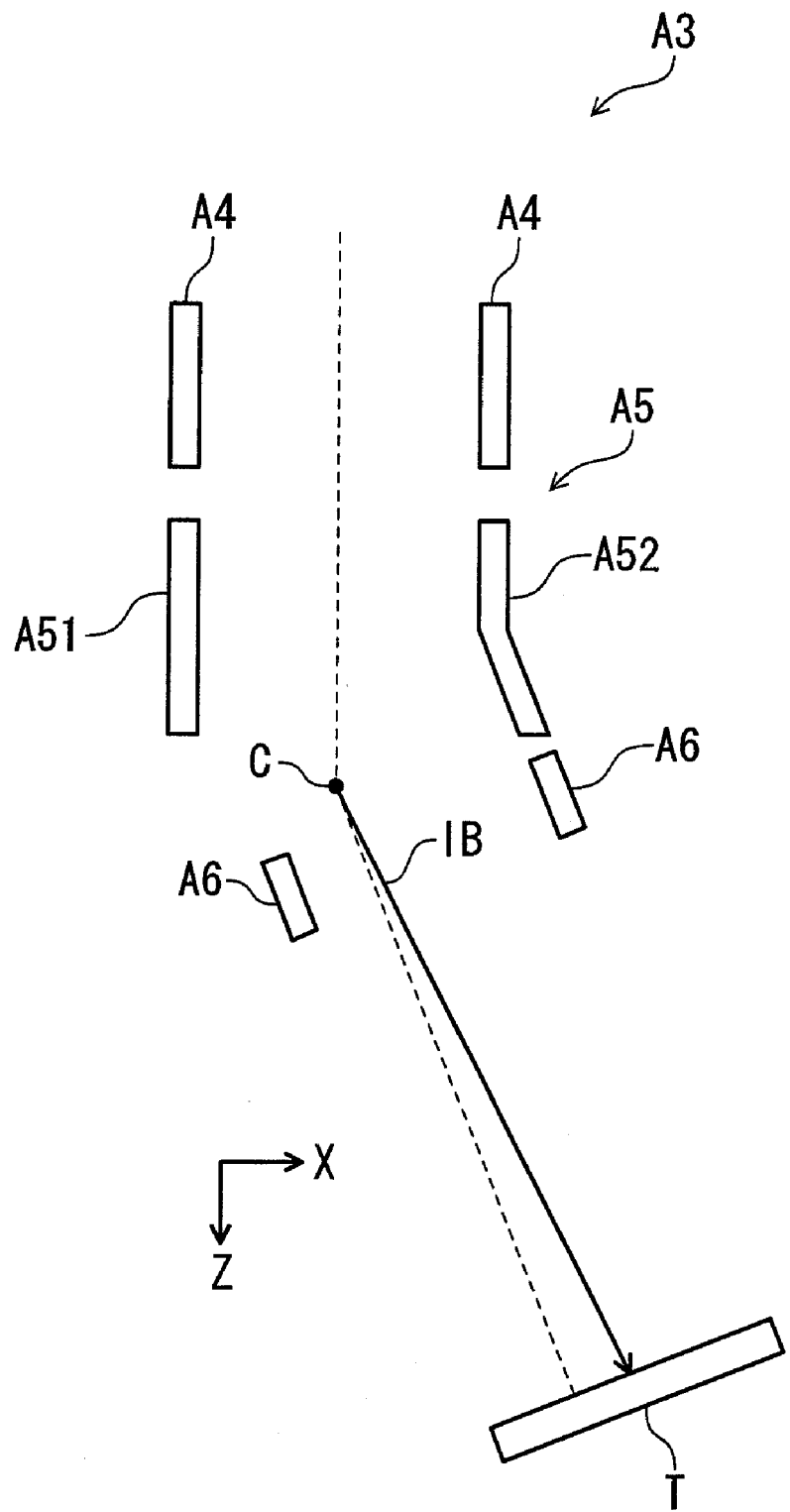
FIG. 3 is a typical view showing the case in which an incident position of the ion beam is adjusted in the conventional ion implanting apparatus.

From a comparison between the result of the simulation shown in FIG. 5 and the result of the simulation shown in FIG. 2 which is carried out by using the conventional ion implanting apparatus A100 illustrated in FIG. 1, it is apparent that a change in a deflecting center position C has a great variation. More specifically, in the acceleration of the ion beam IB, the deflecting center position C is hardly changed as compared with the case of the conventional ion implanting apparatus 100. Although the deflecting center position C is conventionally changed greatly toward the downstream side in the deceleration of the ion beam IB, it is changed slightly toward the upstream side with a rare variation.

For this reason, even if the ion beam IB is accelerated or decelerated, it can be irradiated on a substantially center of the target T in any case.

Next, description will be given to a reason why the deflecting center position C is hardly changed in the acceleration of the ion beam IB and a reason why the deflecting center position C in the deceleration of the ion beam IB is not changed toward the downstream side.

In the acceleration of the ion beam IB, a time taken for receiving a force from an electric field formed by the deflecting electrode 5 is gradually reduced toward the downstream side because the ion is accelerated. In the acceleration, therefore, an influence of an electric field formed on the upstream side is dominant and that of an electric field formed on the downstream side is not very great in respect of the deflection. Since the electric potentials of the upstream electrode 521 and the downstream electrode 522 are set to be equal to each other in the acceleration, furthermore, they approximately act as a substantially integral electrode so that an electric field taking substantially the same shape as the electric field formed by the conventional ion implanting apparatus 100 can be formed. Consequently, the similar result is obtained.

On the other hand, since the ion is decelerated in the deceleration of the ion beam IB, the time taken for receiving the force from the electric field formed by the deflecting electrode 5 is gradually increased toward the downstream side. In the deceleration, therefore, the influence of the electric field formed on the downstream side is dominant in respect of the deflection.

Figure 6:
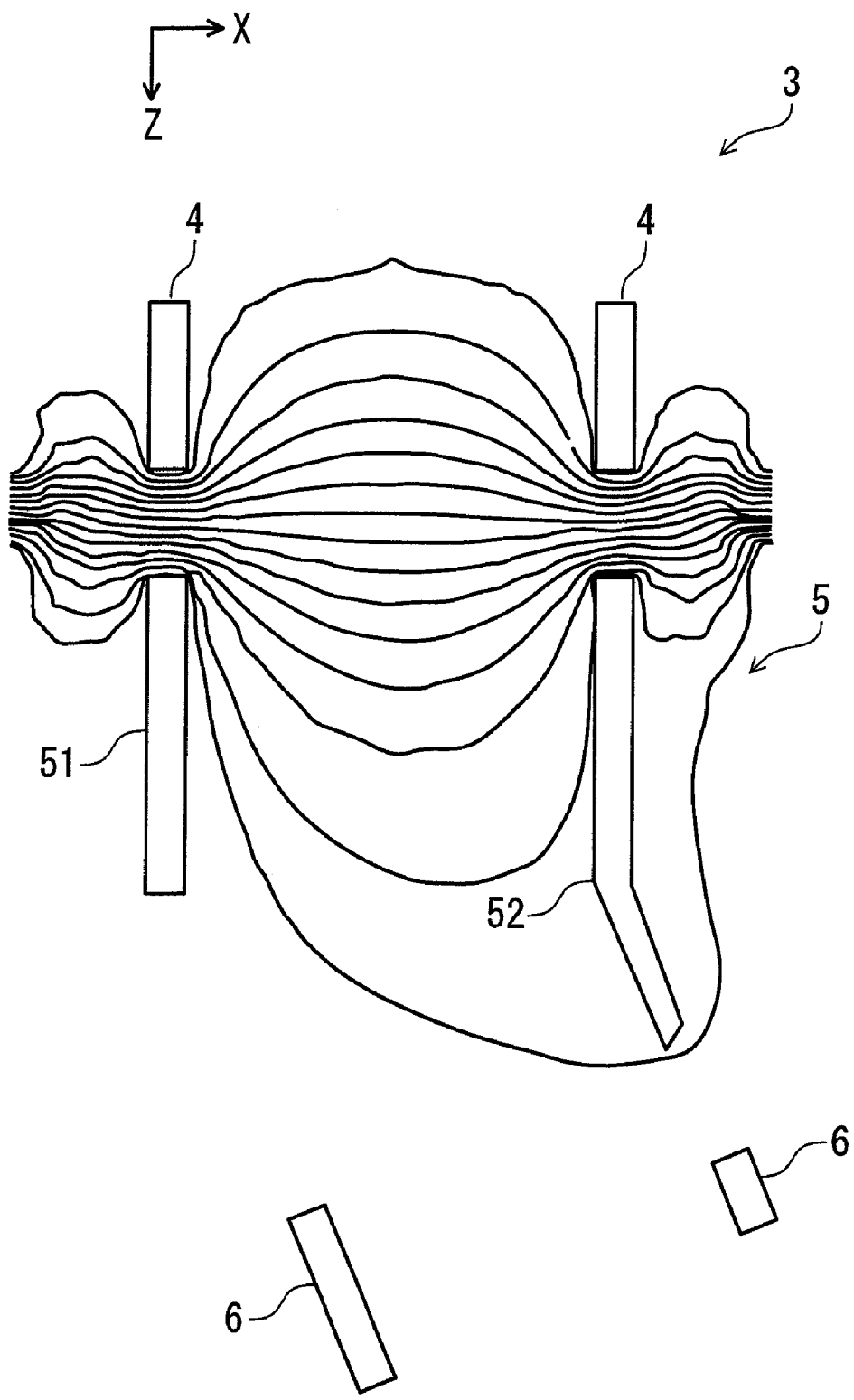
FIG. 6 is a typical view showing an electric field formed between deflecting electrodes in the conventional ion implanting apparatus.

FIG. 6 shows the electric field in the deflecting electrode 5 formed in the deceleration in the conventional ion implanting apparatus 100. In the drawings showing the electric field, there is illustrated only an electric field capable of substantially influencing the deflection of the ion beam IB. As shown in FIG. 6, there is conventionally formed an electric field having an equipotential line (a thick line in the drawing) bulged greatly to a portion between the second deflecting electrode 52 and the counter electrode 6. For this reason, the deflection is greatly carried out on the downstream side. Consequently, the deflecting center position C is changed toward the downstream side.

Figure 7:
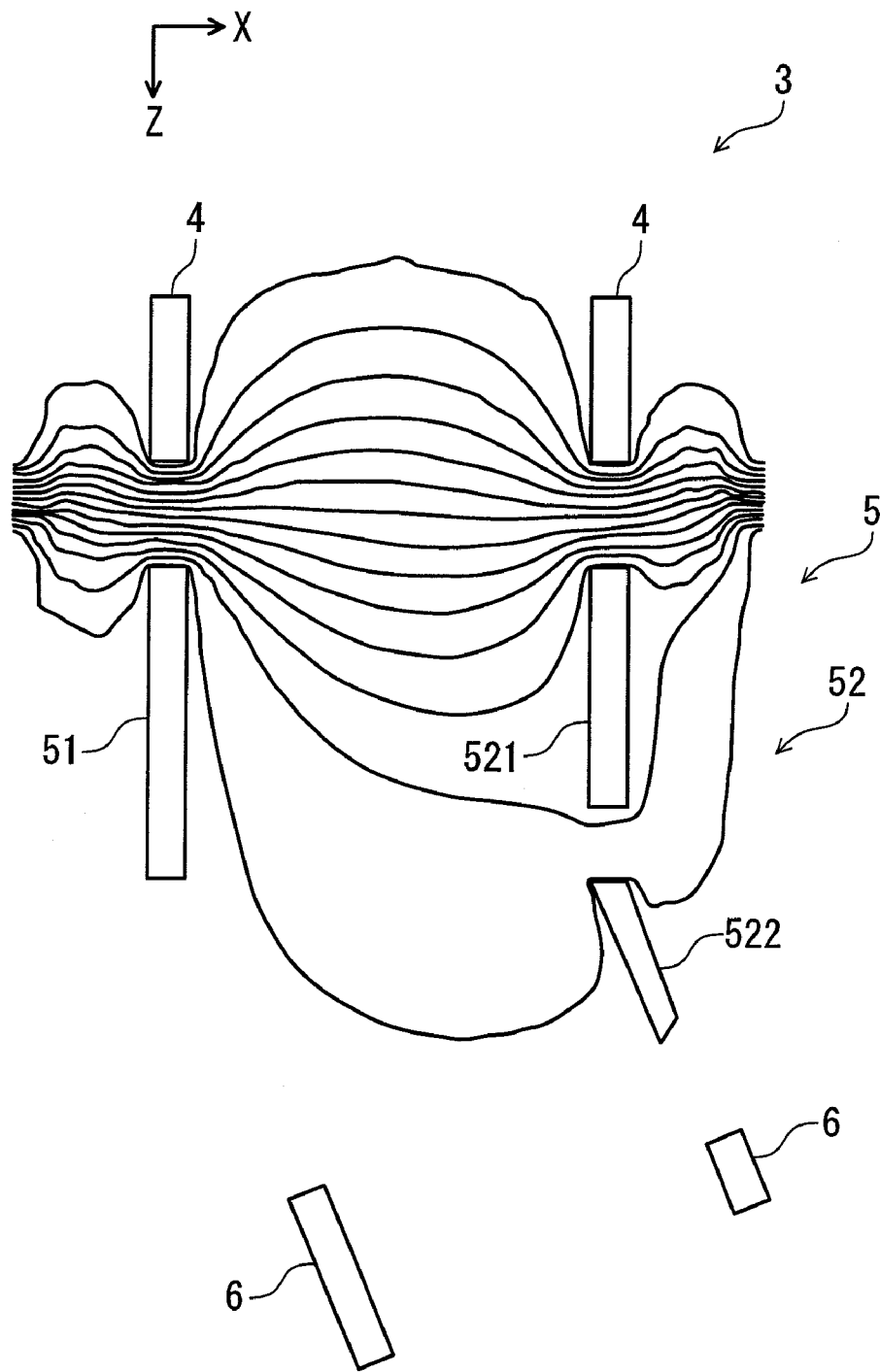
FIG. 7 is a typical view showing an electric field formed between deflecting electrodes in the ion implanting apparatus according to one or more embodiments of the invention.

On the other hand, as shown in FIG. 7, the electric field can be formed between the deflecting electrodes 5 in the ion implanting apparatus 100 according to the embodiment in such a manner that the equipotential line passes through a portion between the upstream electrode 521 and the downstream electrode 522. For this reason, a final equipotential line (a thick line in the drawing) for influencing the deflection of the ion beam IB can be formed on a more upstream side than that in the related art. As compared with the related art, accordingly, the influence of the electric field which is received by the ion beam IB is smaller at the downstream side where the speed of the ion is reduced and a greater deflection is not carried out. Therefore, it is possible to cause the ion beam IB to be incident on the target T at a predetermined angle while obtaining a desirable energy.

In other words, the upstream electrode 521 and the downstream electrode 522 are provided apart from each other and their respective electric potentials can be set independently. Consequently, it is possible to form an electric field in a shape which is hard to take in the related art. Therefore, it is possible to prevent the deflecting center position C from being moved toward the downstream side while causing the ion beam IB to have the desirable energy also in the deceleration. Accordingly, it is possible to cause the ion beam IB to be incident on the target T at a predetermined incident angle in an incident position.

According to the ion implanting apparatus 100 in accordance with one or more embodiments of the invention, thus, the upstream electrode 521 and the downstream electrode 522 are provided apart from each other and their electric potentials can be set independently. Therefore, it is possible to cause the deflecting center position C to be hardly changed also in the deceleration. Moreover, it is possible to prevent the ion beam IB from being greatly shifted from a desirable incident position on the target T.

In addition, it is also possible to bring the incident angle into a desirable state while setting the energy of the ion beam IB into a desirable condition. Also in the acceleration of the ion beam IB, similarly, the deflecting center position C is hardly changed and it is possible to obtain the same advantages as those in the deceleration in respect of the incident position or angle of the ion beam IB on the target T.

Moreover, in one or more embodiments of the invention, the first deflecting electrode 51 and the upstream electrode 521 are provided in such a manner that the optical axis LS of the non-deflected ion beam IB and the opposed surface are extended in parallel with each other, and the opposed surface of the downstream electrode 522 to the ion beam IB is provided to be extended in parallel with an optical axis LE in the incidence of the deflected ion beam IB on the target T. Therefore, the electric field influencing the ion beam IB can be formed within a wide range to some degree. Thus, it is possible to efficiently deflect the ion beam IB having a high energy without using a high power.

Furthermore, in one or more embodiments of the invention, the upstream electrode 521 is set to be longer than the downstream electrode 522. Therefore, the range in which the downstream electrode 522 influences the electric field can be set to be smaller than that for the upstream electrode 521. Therefore, it is not necessary to take care of a change in the deflecting center position C toward the downstream due to an excessive deflection of the ion beam IB even if a negative electric potential required for the deceleration and deflection of the ion beam IB is set to have some magnitude. Accordingly, it is possible to carry out setting to an electric potential in close order to the upstream electrode 521. Consequently, it is also possible to perform rough setting. Therefore, it is not necessary to use a power supply having a very high resolution, resulting in a reduction in a cost.

One or more embodiments of the invention are described as follows. In the following description, corresponding members to those in the previous embodiments have the same reference numerals.

Although the upstream electrode 521 is set to be longer than the downstream electrode 522 in one or more embodiments, the invention is not restricted thereto. For example, although a performance is slightly deteriorated due to a regulation in the electric potentials to be set to the upstream electrode 521 and the downstream electrode 522 respectively, almost the same advantages can be obtained.

Moreover, the upstream electrode 521 may have a curved part in the traveling direction of the deflected ion beam IB in addition to the straight part. In brief, it is sufficient that the upstream electrode 521 and the downstream electrode 522 are provided apart from each other and their electric potentials can be set independently. The conception that they are provided apart from each other in the specification also includes the upstream electrode 521 and the downstream electrode 522 which are connected and integrated with each other through an insulator, for example.

The set value of the electric potential described in one or more embodiments of the invention is only illustrative and may be properly changed depending on the length of the electrode or the type of the ion.

In one or more embodiments of the invention, the second deflecting electrode may be constituted by at least two electrodes. In other words, the second deflecting electrode may be constituted through a division into at least three electrodes and the respective electric potentials may be independently settable. With the structure, similarly, it is possible to cause the electric field in the deceleration of the ion beam to take the desirable shape, thereby preventing the deflecting center position C from being shifted.

Moreover, in one or more embodiments of the invention, the first deflecting electrode may be divided into a plurality of portions.

In addition, various changes can be made, for example, the respective embodiments can be combined without departing from the scope of the invention.

It should be understood that the embodiments disclosed herein are illustrative in all respects and are not restrictive. It is intended that the scope of the invention is described in the claims without the meaning described above and the meaning of equivalents to the claims and all changes in the scope are contained.

The application is based on Japanese Patent Application No. 2008-298794 filed on Nov. 21, 2008, and the contents thereof are incorporated by reference herein.

EXPLANATION OF DESIGNATION

| 100 | ion implanting apparatus |
| 1 | ion source |
| 5 | deflecting electrode |
| 51 | first deflecting electrode |
| 52 | second deflecting electrode |
| 521 | upstream electrode |
| 522 | downstream electrode |
| IB | ion beam |
| T | target |

The invention claimed is:

1. An ion implanting apparatus comprising:
an electrostatic accelerating tube for causing an ion beam extracted from an ion source to have a desirable energy, and deflecting the ion beam to be incident on a target, the electrostatic accelerating tube including deflecting electrodes provided to interpose the ion beam therebetween,
wherein the deflecting electrodes comprise a first deflecting electrode and a second deflecting electrode to which different electric potentials from each other are set,
wherein the second deflecting electrode is provided on a side where the ion beam is to be deflected and includes an upstream electrode provided on an upstream side of the ion beam and a downstream electrode provided apart from the upstream electrode toward a downstream side,
wherein an electric potential of the upstream electrode and an electric potential of the downstream electrode are independently set from each other,
wherein a deflecting center position of the ion beam is not changed greatly as compared with a case in which an acceleration/deceleration of the ion beam is not carried out,
wherein the first deflecting electrode and the upstream electrode are extended in parallel with a traveling direction of the ion beam which is not deflected, and
the downstream electrode is extended in parallel with a traveling direction of the ion beam which is deflected.

2. The ion implanting apparatus according to claim 1, wherein the ion beam has a positive electric charge,
when the ion beam is decelerated to have a lower energy than an energy of the ion beam which is extracted, the downstream electrode is set to have a higher electric potential than that of the upstream electrode so that the deflecting center position is not changed.

3. The ion implanting apparatus according to claim 1, wherein when the ion beam is accelerated to have a higher energy than an energy of the ion beam which is extracted, the downstream electrode is set to have an electric potential which is substantially equal to or lower than an electric potential of the upstream electrode so that a quantity of a change in the deflecting center position toward the upstream side is kept within a range to be permitted.

4. The ion implanting apparatus according to claim 1, wherein a length in which the upstream electrode is extended in the traveling direction of the ion beam which is not deflected is greater than a length in which the downstream electrode is extended in the traveling direction of the ion beam which is deflected.

* * * * *